G. W. PICKARD.

MEANS FOR RECEIVING INTELLIGENCE COMMUNICATED BY ELECTRIC WAVES.

APPLICATION FILED MAR. 9, 1912.

Reissued Sept. 8, 1914. 13,798.

WITNESSES

Daniel Webster Jr.

A. F. Steinbock

BY

INVENTOR

Greenleaf Whittier Pickard

Cornelius D. Ehret his ATTORNEY

UNITED STATES PATENT OFFICE.

GREENLEAF WHITTIER PICKARD, OF AMESBURY, MASSACHUSETTS, ASSIGNOR, BY MESNE ASSIGNMENTS, TO WIRELESS SPECIALTY APPARATUS COMPANY, OF BOSTON, MASSACHUSETTS, A CORPORATION OF NEW YORK.

MEANS FOR RECEIVING INTELLIGENCE COMMUNICATED BY ELECTRIC WAVES.

13,798. Specification of Reissued Letters Patent. Reissued Sept. 8, 1914.

Division of original Patent No. 836,531, dated November 20, 1906, and application Serial No. 342,465, filed November 8, 1906. Original No. 877,451, dated January 21, 1908, Serial No. 401,856. Application for reissue filed March 9, 1912. Serial No. 682,829.

*To all whom it may concern:*

Be it known that I, GREENLEAF WHITTIER PICKARD, a citizen of the United States of America, and a resident of the town of Amesbury, State of Massachusetts, have invented certain new and useful Improvements in Means for Receiving Intelligence Communicated by Electric Waves, the principles of which are set forth in the following specification and accompanying drawing, which discloses the form of the invention which I now consider to be the best of the various forms in which the principles of the invention may be embodied.

This invention relates to means for receiving intelligence communicated by electric waves, and relates more particularly to improvements in detectors of the "rectifier" type.

The object of my invention is to provide improved commercially useful means for operating a device for translating into intelligible form a relatively great part of the energy of the high frequency oscillatory currents, such as generated at a receiving station by the transmitted electro-radiant energy or electric waves.

It is my object to convert as much as possible of the energy of the received oscillations into a form capable of operating an indicating device, such, for example, as a telephone receiver, preferably without the use of any auxiliary energy; and in any case without recourse to the effect of resistance due to conductor attenuation or imperfect contact; and without recourse to a vacuum tube.

Figure 1:
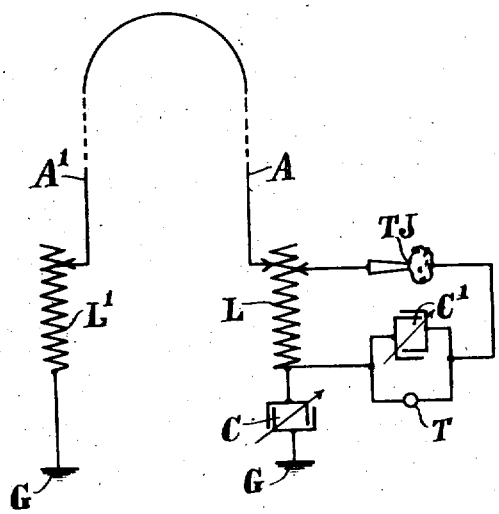
Figure 2:
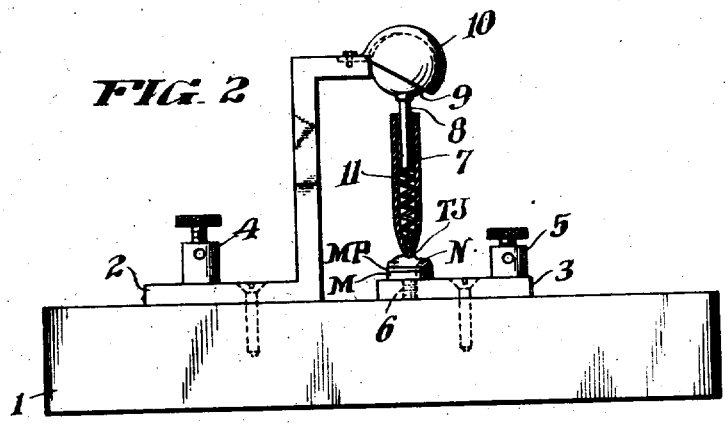
Figure 3:
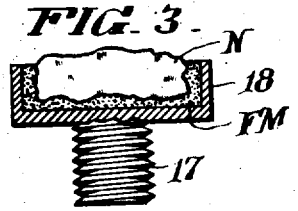

Of the drawings, Figure 1 is a diagrammatic illustration of a well-known form of wireless telegraph receiving station apparatus, this being the apparatus with which the invention has been actually used. Figs. 2 and 3 are a side elevation and section respectively of the present preferred embodiment of the detector employed in the invention in its present most efficient form, Fig. 3 being a slightly modified form.

In Fig. 1 the general arrangement is a well-known loop form of wave-intercepter A, A′ operatively provided with the usual adjustable capacity C, inductance L, adjustable in both the wave-intercepter and oscillation-receiving circuits, the inductance L′, adjustable in the wave-intercepter circuit, and the connection of the latter circuit to ground at G.

In Fig. 1, the circuit L, T, J, C′—T, L receives the oscillations generated in the wave-intercepting loop A, A′, the inductance L being adjustable in the oscillation circuit which is well adapted for use with the oscillation receiver or detector of this invention, as it includes the adjustable condenser C′, and the indicating device T in shunt to this condenser. The device is preferably a telephone receiver and may be any other form of device such as a sensitive galvanometer which will indicate an abrupt flow of direct current. The receiver or detector should in use be maintained in good electrical connection in the oscillation circuit, and the contact-junction T J should be a substantially perfect electrical contact. The lead to the shunt-connected condenser C′ and the telephone T is taken from the lower end of the inductance L, so that the telephone and its parallel connected condenser are in series between the detector and a part of the inductance L which is at lower potential with respect to the ground.

The receiver or detector of this invention, roughly indicated at T J in Fig. 1 is shown in detail in Fig. 2. To a wooden base L are secured an angular metal support 2 and a metal plate 3, provided with binding posts 4, 5 for the leads of the oscillating circuit of Fig. 1. One element of the detector is the chuck which is removably screwed into the plate 3 by the part 6. This chuck consists of a piece of metal M, to which is soldered a metallic plating MP, such as copper or silver, which plating is deposited on the material N in order to provide a large area of surface contact between them, as compared with the area of the contact junction T J. The deposition may be by electro-plating or by fusing a layer of the material N upon a metallic surface, or other-wise; and as shown in Fig. 3, it is sufficient to place the material N in a liquefied mass of fusible metal F M in a chuck-cup 18, provided with a screw 17, so that when the metal F M cools and solidifies, the material N will be firmly embedded in, and in good electrical and large-areaed contact with the metal F M.

The operative contact-junction (T J of Fig. 1) is located at the lower end of the hollow metallic sleeve 7 of Fig. 2, which junction is of substantially less surface area than that of the contact between N and M P. The sleeve 7 can slide along the metallic projection 8, which depends from the metallic ball 9, the ball forming a ball-and-socket universal joint with the part 10 of thin metal, which is stamped to shape and secured to the metallic support 2 so as to complete the circuit. The member 7 of the receiver may be of any conductor which coöperates properly with the member N. The member N may be of the element silicon, which appears to be most useful either in the massive amorphous or graphitic solid form; or it may be a suitable equivalent which accomplishes the objects of the invention, *i. e.*, a conductor within the scope of the invention which possesses high resistivity and which when operatively in substantially perfect electrical contact with the other conductor, as 7, operates in coöperation therewith to produce a direct current occurring intermittently, and charging one side of the condenser, the discharge of which is suitable for operating the indicating device. When the member 7 is metallic, as of copper in accordance with this disclosure, and therefore has low resistivity, there is a very substantial difference in the degree of resistivity possessed by the two conductors. When the member N has high thermoelectromotive power in coöperation with the member 7, in addition to high resistivity, or when there is a substantial difference in the resistivity of the two conductors, a considerable part of the energy of the received oscillations is concentrated in the form of Joulean heat, at the contact junction, where it may be converted into a direct current owing to the coöperative thermo-electromotive power of the two conductors. The junction between the massive conductors 7 and N should be a substantially perfect electrical contact, and this is secured by the spring 11, which presses the two conductors together with sufficient force to exclude substantially all contact resistance and action of a loose-contact or coherer nature arising from the resistance of an imperfect contact, such as to cause the contact to be a substantially perfect one. Such a perfect contact not only accomplishes the objects of the invention, but avoids the uncommercial instability of imperfect contacts. The spring 11 also serves to make good contact between the part 7 and the good conducting part 8, and also presses the good conducting part 8 into good contact with the conducting part 10 which is secured to part 2, thus establishing a good electrical connection between part 7 and its circuit-terminal 4. No means for delicate adjustment of the spring-pressure, such as a fine screw, is necessary, since operatively the spring is such as to always exert sufficient pressure to insure a substantially perfect contact. The spring 11 however, coöperatively with the movable part 8, permits the selection by manual adjustment of different locations of the contact T J, owing, in this disclosure, to inequalities of different parts of the operating surface of part N, whereby the pressure of the spring is slightly varied within the limits of perfect contact pressure, so as to slightly vary the area of electrical contact and the sensitiveness of operation under different external conditions of use. In no case, however, is it necessary to continuously move either 7 or N with respect to each other during operation. The device is most efficient in the form shown, as to the lower end of part 7 having a substantial rounded surface in physical contact of considerable area with part N, but having an extremely small electrical contact therewith. In no case need either member 7 or N possess such attentuation as might thereby generate heat.

In order to obtain the best results, the above specification should be carefully followed. So far I have been able to convert upward of ten percent. of the energy of the oscillations into direct current energy. The device is therefore an electrical converter or rectifier. In the preferred form of this invention the action due to the inherent properties of the silicon member or its equivalent is of extraordinary vigor, as is indicated by the fact that the only energy employed to commercially operate the telephone T is that of the received oscillations. All resistance-varying action should be reduced to a minimum, as by employing the conductors in substantially massive form and in substantially perfect contact with each other, because the energy of the oscillations should not be wasted without contributing substantially to effective action.

The energy required to commercially operate a telephone, that is, to produce in it a clearly defined dot, in, for example, the Morse code, is approximately one millionth ($1\times10^{-6}$) erg. The energy received in long-distance wireless communication is, at the minimum, of the order of magnitude of one-thousandth of an erg per dot. The efficiency of the apparatus of this invention, as demonstrated by trial under commercial conditions, is upward of ten percent. There is thus ample margin for commercial operativeness for the least sensitive form of this invention in the case of the present longest distance wireless telegraphy.

The speed of reception with this invention is unlimited, since it is not only self-restoring to its sensitive state, but this restoration is practically instantaneous because, so far as the thermo-electromotive action is concerned, the small quantity of heat which is generated by the received oscillations comprising a signal is rapidly conducted away, partly by thermal conduction to the metal portion 7, and the remainder by the conversion into an electric current which finally expends its energy in the indicating device.

The advantages of the new detector are as follows. It fulfils all requirements of commercial wireless telegraphy as to sensitiveness, speed, stability and freedom from delicate adjustments. I have found that the continued sensitiveness of the detector is in no wise impaired by severe static discharges. It is also simple and cheap in construction. It is not affected by changes in atmospheric temperature or humidity. Its sensitiveness so far has not been impaired by continuous and continued use.

I am aware of the existence in the prior art of a rectifier detector consisting of a pair of conductors which coöperatively have high resistivity, or in which at least one has high resistivity, and in which such conductors are held in substantially perfect small areaed contact with each other. An example of such a rectifier detector is that of Hughes comprising carbon in small areaed perfect contact with steel as set forth in "a history of wireless telegraphy" by Fahie, 1901 Edition, page 313. A further prior disclosure of a rectifier detector is in U. S. Patent No. 763,894 to Hogg, where the pair of conductors consists of steel or other metal in perfect small areaed contact with selenium, annealed selenium or selenids of metals, selenium in any conducting form and selenids of metals having high resistivity. These rectifiers of the prior art may be used either with or without a local source of energy.

While my invention relates to a detector of the rectifier class, examples of which are referred to above, my invention resides in improvements having the advantages hereinbefore set forth, and having a novel and useful structure and association with other parts as set forth in the appended claims.

What I claim is:

1. Means for receiving intelligence communicated by electromagnetic waves, which comprises two substantially massive individual electrical conductors operatively in substantially perfect contact with each other, said conductors having different degrees of resistivity, and coöperatively having high resistivity, at least one of said conductors having high resistivity; in combination with a mass of fusible metal supporting said high resistance conductor, and a supporting receptacle for said fusible metal.

2. Means for receiving intelligence communicated by electromagnetic waves, which comprises two substantially massive individual electrical conductors of different degrees of resistivity, and coöperatively having high resistivity, at least one of which conductors possesses high resistivity; in combination with a spring which operatively holds the said conductors in substantially perfect small-areaed electrical contact with each other; and a freely movable, non-threaded support for said spring to permit a variation of contact pressure within wide limits of substantially perfect contact pressure, and thereby slightly vary the area of the minute electrical contact.

3. Means for receiving intelligence communicated by electric waves, which comprises a rectifying member in contact with a conductor of different material, in combination with a mass of readily fusible metal in which said rectifying member is firmly embedded and in good electrical and large-areaed contact.

4. Means for receiving intelligence communicated by electric waves, which comprises a rectifying member in contact with a conductor of different material, in combination with a mass of readily fusible metal in which said rectifying member is firmly embedded in good electrical and large-areaed contact, and a receptacle for receiving the liquefied mass of fusible metal and holding the same after it has cooled and solidified.

5. Means for receiving intelligence communicated by electro-magnetic waves, which comprises the combination with a rectifying conductor having a contact surface consisting of a substantially plane area, of a manually movable contact-point-carrier, having an end which is directed toward said contact surface, but which is structurally independent thereof, and has free transverse movement relative thereto; a guide with which said carrier has movable relation under said manual control, said guide being movably supported at a point remote from the free end of the carrier, whereby the guide and carrier may be bodily moved, and said free end of the carrier be moved into various different positions relative to said contact surface; and a helical spring operatively mounted between said guide and carrier to press the latter toward said contact surface, said spring being carried with said guide and carrier into their various different positions.

6. In a converter or rectifier for feeble alternating or oscillatory currents, the combination with a rectifying conductor, of a different conductor in contact therewith, means for supporting one of said members to permit manual movement of it to select contacts between the two members on different parts of the rectifying member, and a helical spring mounted coaxially with said manual member and bodily movable therewith.

7. Means for receiving intelligence communicated by electro-magnetic waves, which comprises the combination with a rectifying conductor having a contact surface consisting of a substantially plane area, of a manually movable contact-point-carrier, having an end which is directed toward said contact surface, but which is structurally independent thereof, and has free transverse movement relative thereto; a guide with which said carrier has movable relation under said manual control, said guide having a ball joint remote from the free end of the carrier whereby said free end may be manually moved into all positions relative to said contact surface; and a helical spring operatively mounted between said guide and carrier to press the latter toward said contact surface, said spring being carried with said guide and carrier into their various different positions.

8. Means for receiving intelligence communicated by electro-magnetic waves, which comprises the combination with a rectifying conductor having a contact surface consisting of a substantially plane area and possessing slight irregularities, of a contact point therefor, having an end which is directed toward said contact surface, but which is structurally independent thereof; a helical spring constructed and arranged to press the contact point against the contact surface; and means, combined with the spring, to permit the manual alteration of the contact junction from one point to another of the irregular contact surface of the rectifying conductor.

9. Means for receiving intelligence communicated by electro-magnetic waves, which comprises the combination with a mass of fusible metal, of a rectifying conductor mounted therein and having exposed therefrom a contact surface consisting of a substantially plane area; and a coöperating contact directed toward said contact surface; said fusible metal mass and said coöperating contact having relative movement permitting the manual alteration of the contact between the coöperating contact and the surface of the rectifying conductor.

10. Means for receiving intelligence communicated by electro-magnetic waves, which comprises the combination with a mass of fusible metal, of a rectifying conductor embedded therein, but having exposed therefrom a contact surface consisting of a substantially plane area possessing slight irregularities; a manually movable contact-carrier having an end directed toward said contact surface; a guide with which said carrier has sliding relation, said guide being pivoted to permit the movement of the carrier into various different positions relative to the rectifier contact surface; and a helical spring mounted between said guide and said carrier, permitting the carrier to be slid away from the irregular contact surface, and pressing the contact against said surface when the carrier is manually permitted to return toward said surface.

11. Means for receiving intelligence communicated by electro-magnetic waves which comprises the combination with a rectifying conductor having a contact surface consisting substantially of a plane area; of a coöperating contact member therefor; means for movably supporting one of said members to permit the manual selection of the contact junction between them; and a helical spring, combined with said means, and bodily movable with one of said members and acting to press them into good contact with each other.

12. Means for receiving intelligence communicated by electro-magnetic waves, which comprises the combination with a rectifying conductor having a contact surface consisting substantially of a plane area; of a coöperating contact member operatively located substantially at right angles to said surface, one of said members being movably and resiliently mounted, whereby such member may be removed from contact with the other, and replaced with a different contact junction, and in good contact therewith.

13. Means for receiving intelligence communicated by electro-magnetic waves, which comprises the combination with a rectifying conductor, having a contact surface consisting of a substantially plane area; of a coöperating contact point therefor having an end which is directed toward said plane surface and which is structurally independent thereof to permit free relative transverse movement; and means to permit the manual alteration of the location of the contact junction of the two conductors in the plane of the contact surface of the rectifying conductor.

14. Means for receiving intelligence communicated by electro-magnetic waves, which comprises the combination with a rectifying conductor having a contact surface consisting substantially of a plane area; of a coöperating contact making small areaed electrical contact therewith; means for fixing one of said contacts from movement toward the other; and means, including a spring, to permit the other conductor to move to and from and transversely of the other.

15. Means for receiving intelligence communicated by electromagnetic waves, which comprises two individual massive electrical conductors of different degrees of resistivity and coöperatively having high resistivity, at least one of which conductors having high resistivity; in combination with a supporting member having a telescopic joint with one of said conductors; a spring operatively located within the telescopic joint to hold the two conductors in substantially perfect contact with each other; and means to permit the manual alteration of the location of the contact junction of the two conductors.

16. In a detector device of the character described, a cup, a detector member, conducting material holding said detector member in said cup, a second detector member, said first detector member having a surface exposed toward second detector member, means for pressing said detector members into substantially perfect contact, and means permitting movement of said second detector member to any part of said exposed surface of said first detector member.

In testimony whereof I have hereunto affixed my signature in the presence of the two subscribing witnesses.

GREENLEAF WHITTIER PICKARD.

Witnesses:
A. H. TEABURY,
WILLIAM J. BRESLIN.